(12) United States Patent
Huber

(10) Patent No.: US 8,173,446 B2
(45) Date of Patent: May 8, 2012

(54) METHOD OF PRODUCING AN INTEGRATED MICROMAGNET SENSOR ASSEMBLY

(75) Inventor: William Hullinger Huber, Scotia, NY (US)

(73) Assignee: General Electric Company, Schenectady, NY (US)

( * ) Notice: Subject to any disclaimer, the term of this patent is extended or adjusted under 35 U.S.C. 154(b) by 150 days.

(21) Appl. No.: 12/642,968

(22) Filed: Dec. 21, 2009

(65) Prior Publication Data

US 2011/0151587 A1   Jun. 23, 2011

(51) Int. Cl.
  *H01L 21/00* (2006.01)
(52) U.S. Cl. ............... 438/3; 438/48; 257/422; 257/425
(58) Field of Classification Search ............... 438/3, 48; 257/422, 425; 360/324
  See application file for complete search history.

(56) References Cited

U.S. PATENT DOCUMENTS

| | | | |
|---|---|---|---|
| 3,892,603 A | 7/1975 | Reid | |
| 5,729,129 A | 3/1998 | Acker | |
| 5,752,513 A | 5/1998 | Acker et al. | |
| 5,782,765 A | 7/1998 | Jonkman | |
| 5,893,206 A | 4/1999 | Furlani et al. | |
| 5,982,177 A * | 11/1999 | Cadieu | 324/252 |
| 6,172,499 B1 | 1/2001 | Ashe | |
| 6,211,666 B1 | 4/2001 | Acker | |
| 6,241,671 B1 | 6/2001 | Ritter et al. | |
| 6,246,231 B1 | 6/2001 | Ashe | |
| 6,427,079 B1 | 7/2002 | Schneider et al. | |
| 6,493,573 B1 | 12/2002 | Martinelli et al. | |
| 6,528,991 B2 | 3/2003 | Ashe | |
| 6,636,757 B1 | 10/2003 | Jascob et al. | |
| 6,676,813 B1 | 1/2004 | Pelekhov et al. | |
| 6,690,963 B2 | 2/2004 | Ben-Haim et al. | |
| 6,701,179 B1 | 3/2004 | Martinelli et al. | |
| 6,784,660 B2 | 8/2004 | Ashe | |
| 6,789,043 B1 | 9/2004 | Nelson et al. | |
| 6,812,842 B2 | 11/2004 | Dimmer | |
| 6,822,570 B2 | 11/2004 | Dimmer et al. | |
| 6,838,990 B2 | 1/2005 | Dimmer | |
| 6,856,823 B2 | 2/2005 | Ashe | |
| 7,174,202 B2 | 2/2007 | Bladen et al. | |

(Continued)

FOREIGN PATENT DOCUMENTS

EP     42707     12/1981

(Continued)

OTHER PUBLICATIONS

Lagorce et al, Magnetic and Mechanical Properties of Micromachined Strontium Ferrite/Polyimide Composites, Journal of Microelectromechanical Systems, vol. 6, No. 4, Dec. 1997, pp. 307-312.

(Continued)

*Primary Examiner* — Mary Wilczewski
*Assistant Examiner* — Toniae Thomas

(57) ABSTRACT

A method of integrating a permanent bias magnet within a magnetoresistance sensor comprising depositing an alternating pattern of a metal material and a semiconductor material on or within a surface of an insulating substrate; depositing a mask on the surface of the insulating substrate to create an opening above the alternating pattern of metal material and semiconductor material; applying a magnetic paste within the opening above the alternating pattern of metal material and semiconductor material; curing the magnetic paste to form a hardened bias magnet; removing the mask; and magnetizing the hardened bias magnet by applying a strong magnetic field to the hardened bias magnet at a desired orientation.

16 Claims, 6 Drawing Sheets

U.S. PATENT DOCUMENTS

| | | |
|---|---|---|
| 7,176,798 B2 | 2/2007 | Dimmer et al. |
| 7,324,915 B2 | 1/2008 | Altmann et al. |
| 7,373,271 B1 | 5/2008 | Schneider |
| 7,402,996 B2 | 7/2008 | Arai et al. |
| 2003/0011359 A1 | 1/2003 | Ashe |
| 2003/0173953 A1 | 9/2003 | Ashe |
| 2003/0233042 A1 | 12/2003 | Ashe |
| 2005/0245821 A1 | 11/2005 | Govari et al. |
| 2005/0261566 A1 | 11/2005 | Hanley |
| 2006/0023369 A1* | 2/2006 | Carey et al. .................. 360/324 |
| 2007/0078334 A1 | 4/2007 | Scully et al. |
| 2008/0001756 A1 | 1/2008 | Dimmer et al. |
| 2008/0269596 A1 | 10/2008 | Revie et al. |

FOREIGN PATENT DOCUMENTS

| | | |
|---|---|---|
| JP | 2002365010 | 12/2002 |
| WO | WO9960370 | 11/1999 |
| WO | WO0032179 | 6/2000 |

OTHER PUBLICATIONS

Heremans et al, Narrow-gap semiconductor magnetic field sensors and applications, Semicond. Sci. Technol. 8 (1993), S424-S430.

* cited by examiner

US 8,173,446 B2

METHOD OF PRODUCING AN INTEGRATED MICROMAGNET SENSOR ASSEMBLY

BACKGROUND OF THE INVENTION

This disclosure relates generally to magnetic sensors, and more particularly to the low cost integration of micron-scale permanent magnets with magnetic sensors for generating a large, relatively uniform perpendicular bias field that may be used to maximize the sensitivity of semiconductor magnetoresistance sensors.

Semiconductor magnetoresistance sensors are a promising class of solid-state magnetic sensors. These sensors consist of a substrate of patterned, high mobility semiconducting films. Some non-limiting examples of patterned, high mobility semiconducting films include indium antimonide (InSb), indium arsenide (InAs), gallium antimonide (GaSb), gallium arsenide (GaAs) and grapheme. The application of a perpendicular magnetic field to the substrate of a patterned, high mobility semiconducting film deflects the current in the substrate of the patterned, high mobility semiconducting film, resulting in an increased path length and hence an increased resistance. By optimizing the geometry of the semiconductor magnetoresistance sensor, the sensitivity can be maximized.

While magnetoresistance sensors have been developed for some time, they have not had broad commercial applicability, due in part to the need to apply a large perpendicular magnetic bias field (approximately 0.1 to 0.2 Tesla) to achieve high sensitivity. For certain applications such as clearance sensors for automotive applications, macroscopic permanent magnets are either already present or can be easily integrated into a desired location. Thus, magnetoresistance sensors have been intensively investigated for automotive applications.

However, a much larger range of magnetic sensor applications require that the entire assembly (sensor and magnet) must be compact. Examples include surface mount semiconductor packages and electromagnetic tracking devices for medical instruments, such as needles, catheters and guidewires, etc.

Macroscopic permanent magnets are typically fabricated by pressure sintering permanent magnet powder (e.g., neodymium iron boron (NdFeB)) into a desired form. While these magnets are capable of achieving very large magnetic fields on their faces (approximately 0.5 Tesla) they cannot be shrunk down to less than approximately 1 $mm^3$ volumes needed for space constrained applications. In addition, as each magnet is fabricated separately, precise placement and bonding of the magnet within the magnetoresistance sensor is very difficult.

Alternatively, perpendicular magnetic bias fields can be generated using magnetic thin films with perpendicular anisotropy. Examples include iron gadolinium terbium (FeGdTb) alloys and a cobolt platinum (CoPt) multilayer. Unfortunately, however, to generate a large (approximately 0.1 to 0.2 Tesla) uniform magnetic field over the front face requires that the thickness of the film be approximately as large as the base (dependent upon the detailed magnetic properties of the material). Thus, a magnetic sensor with an active area of approximately 0.25 mm×0.25 mm would require a permanent magnet material that is at least approximately 0.15 mm thick (dependent upon the detailed magnetic properties of the material). At this film thickness, traditional thin film process techniques such as sputtering, evaporation or chemical vapor deposition are not feasible. While electroplating has been used to create magnetic films of thicknesses up to approximately 30 μm, the magnetic properties are too poor for magnetic field values needed for magnetoresistance sensors.

Therefore, there is a need for low cost integration of micron-scale permanent magnets within magnetic sensors for generating a large, relatively uniform perpendicular magnetic bias field that may be used to maximize the sensitivity of semiconductor magnetoresistance sensors.

BRIEF DESCRIPTION OF THE INVENTION

In accordance with an aspect of the disclosure, a method of integrating a permanent bias magnet within a magnetoresistance sensor comprising depositing an alternating pattern of a metal material and a semiconductor material on or within a surface of an insulating substrate; depositing a mask on the surface of the insulating substrate to create an opening above the alternating pattern of metal material and semiconductor material; applying a magnetic paste within the opening above the alternating pattern of metal material and semiconductor material; curing the magnetic paste to form a hardened bias magnet; removing the mask; and magnetizing the hardened bias magnet by applying a strong magnetic field to the hardened bias magnet at a desired orientation.

In accordance with an aspect of the disclosure, a method of producing an integrated magnetoresistance sensor assembly including a permanent bias magnet comprising depositing an alternating pattern of a metal material and a semiconductor material on or within a surface of an insulating substrate; depositing a photoresist mask on the surface of the insulating substrate in a pattern that covers the surface of the insulating substrate, but leaves an opening above the alternating pattern of metal material and semiconductor material; applying a magnetic paste over the photoresist mask and the opening above the alternating pattern of metal material and semiconductor material; removing the magnetic paste from above the photoresist mask, but leaving the magnetic paste within the opening above the alternating pattern of metal material and semiconductor material; curing the magnetic paste within the opening above the alternating pattern of metal material and semiconductor material to form a hardened bias magnet; removing the photoresist mask from around the hardened bias magnet; and applying a strong magnetic field to the hardened bias magnet at a desired orientation to magnetize the hardened bias magnet.

Various other features, aspects, and advantages will be made apparent to those skilled in the art from the accompanying drawings and detailed description thereof.

DETAILED DESCRIPTION OF THE INVENTION

Figure 1:
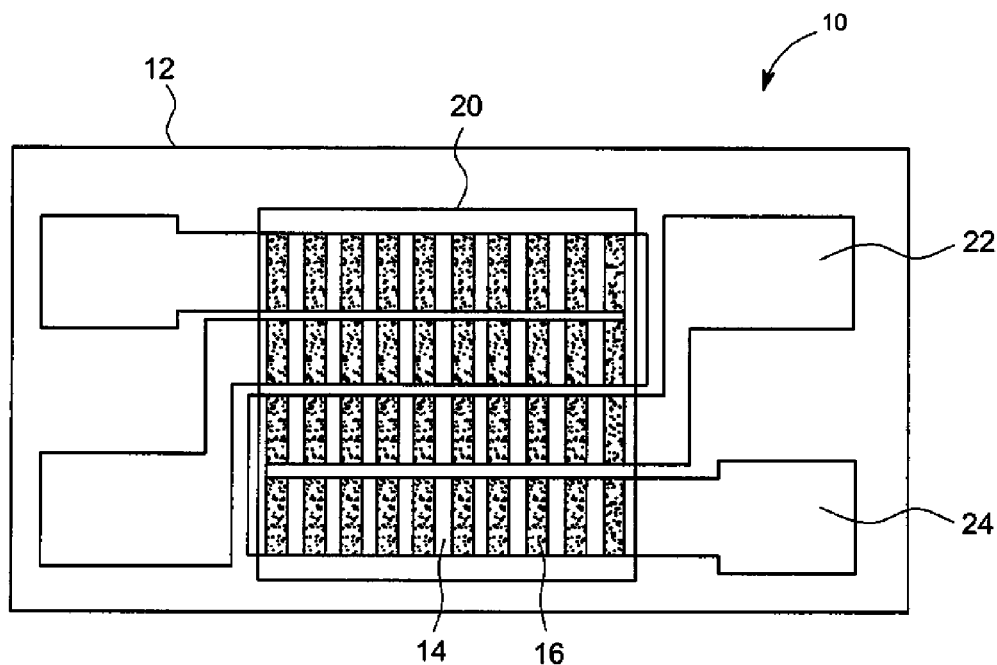
FIG. 1 is an enlarged top view of an exemplary embodiment of a magnetoresistance sensor.
Figure 2:
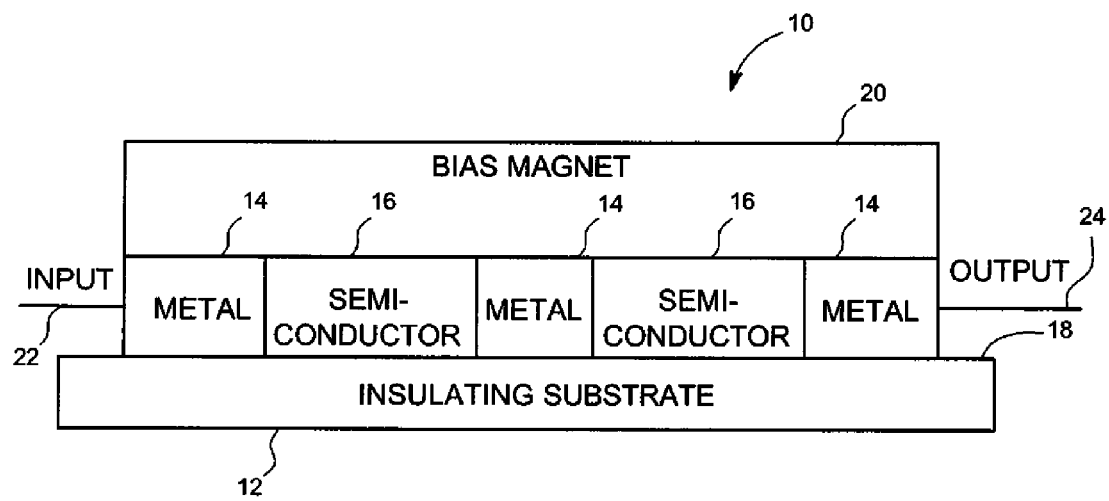
FIG. 2 is an enlarged side view of an exemplary embodiment of a magnetoresistance sensor.

Referring now to the drawings, FIG. 1 illustrates an enlarged top view of an exemplary embodiment of a magnetoresistance sensor 10. A magnetoresistance device is a device that provides a change in electrical resistance of a conductor or semiconductor when a magnetic field is applied. The device's resistance depends upon the magnetic field applied. As shown in FIG. 2, the magnetoresistance sensor 10 comprises an insulating substrate 12, an alternating pattern of a metal material 14 and a semiconductor material 16 deposited on a surface 18 of the insulating substrate, and a bias magnet material 20 deposited over the alternating pattern of metal material 14 and semiconductor material 16. FIG. 2 illustrates an enlarged side view of an exemplary embodiment of a magnetoresistance sensor 10. The alternating pattern of metal material 14 and semiconductor material 16 creates a composite structure with alternating bands of metal material 14 and semiconductor material 16. At least one input connection contact 22 is coupled to the metal material 14 and at least one output connection contact 24 is coupled to the metal material 14.

The semiconductor material 16 may be series connected to increase the magnetoresistance sensor 10 resistance. In an exemplary embodiment, the semiconductor material 16 may be comprised of a single semiconductor element. The bias magnet material 20 subjects the semiconductor material 16 to a magnetic field required to achieve required sensitivity. The magnetoresistance sensor 10 provides a signal in response to the strength and direction of a magnetic field. The magnetic field may be approximately 0.1 to 0.2 Tesla.

The application of a magnetic field confines the electrons to the semiconductor material 16, resulting in an increased path length. Increasing the path length, increases the sensitivity of the magnetoresistance sensor 10. The magnetic field also increases the resistance of the magnetoresistance sensor 10. In the geometry disclosed in FIGS. 1 and 2, at a zero magnetic field, the current density is uniform throughout the magnetoresistance sensor 10. At a high magnetic field, the electrons (or holes) propagate radially outward toward the corners of the semiconductor material 16, resulting in a large magnetoresistance (high resistance).

Many new clinical applications include tracking of a variety of devices including catheters, guidewires, and other endovascular instruments that require sensors to be very small in size (millimeter dimensions or smaller). The form factor of the magnetoresistance sensor 10 may be scaled to sizes less than 0.1 mm x 0.1 mm.

In an exemplary embodiment, the magnetoresistance sensor may be built with various architectures and geometries, including, giant magnetoresistance (GMR) sensors, and extraordinary magnetoresistance (EMR) sensors.

The magnetoresistance sensor 10 provides a very small form factor, excellent signal-to-noise ratio (low noise operation), and excellent low frequency response. Low noise combined with wide dynamic range enables the magnetoresistance sensor 10 to be used for position and orientation tracking. The low frequency response of the magnetoresistance sensor 10 allows a position and orientation tracking system to operate at very low frequencies where metal tolerance is maximized.

Figure 3:
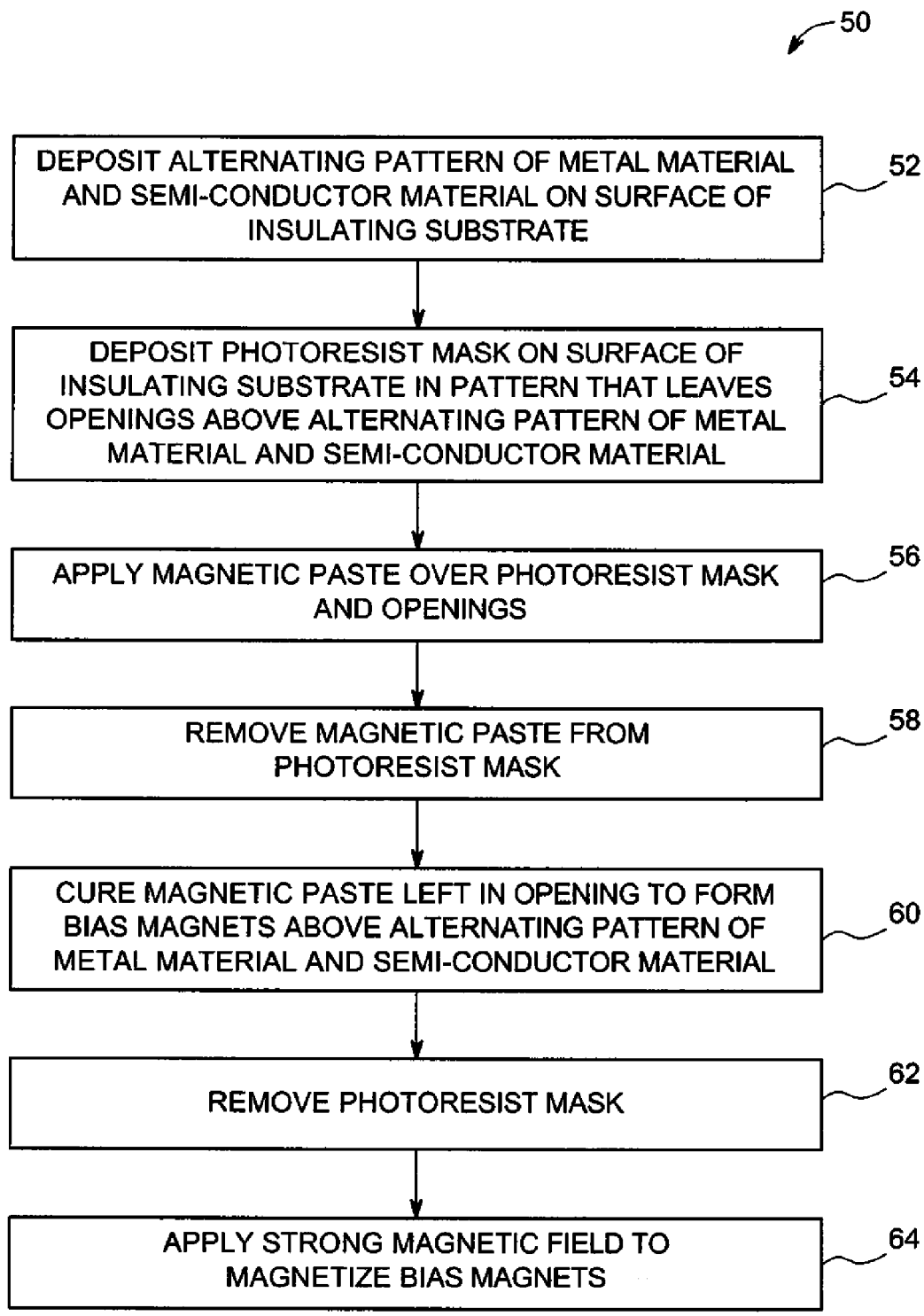
FIG. 3 is a flow diagram of an exemplary embodiment of a method of integrating a permanent bias magnet within a magnetoresistance sensor.
Figure 4:
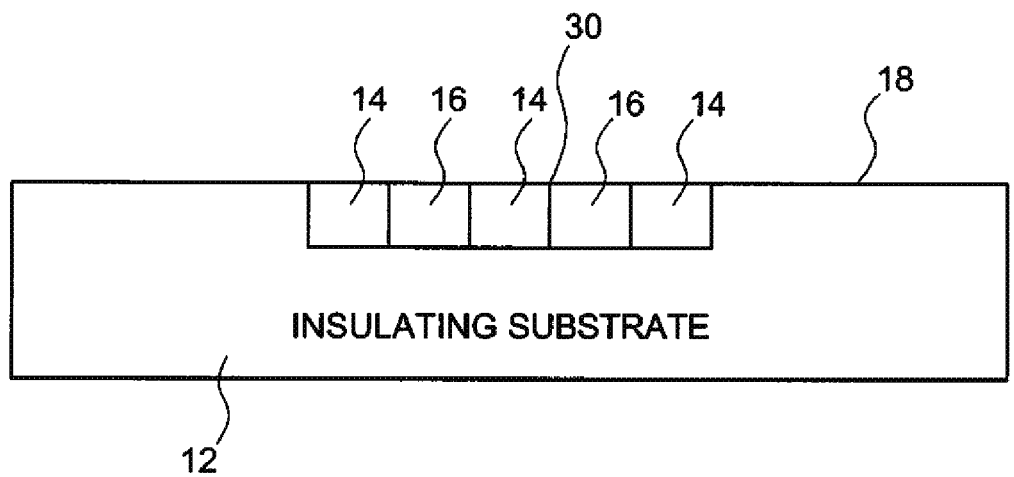
FIG. 4 is a schematic diagram of an exemplary embodiment of a step in a method of integrating a permanent bias magnet within a magnetoresistance sensor.
Figure 5:
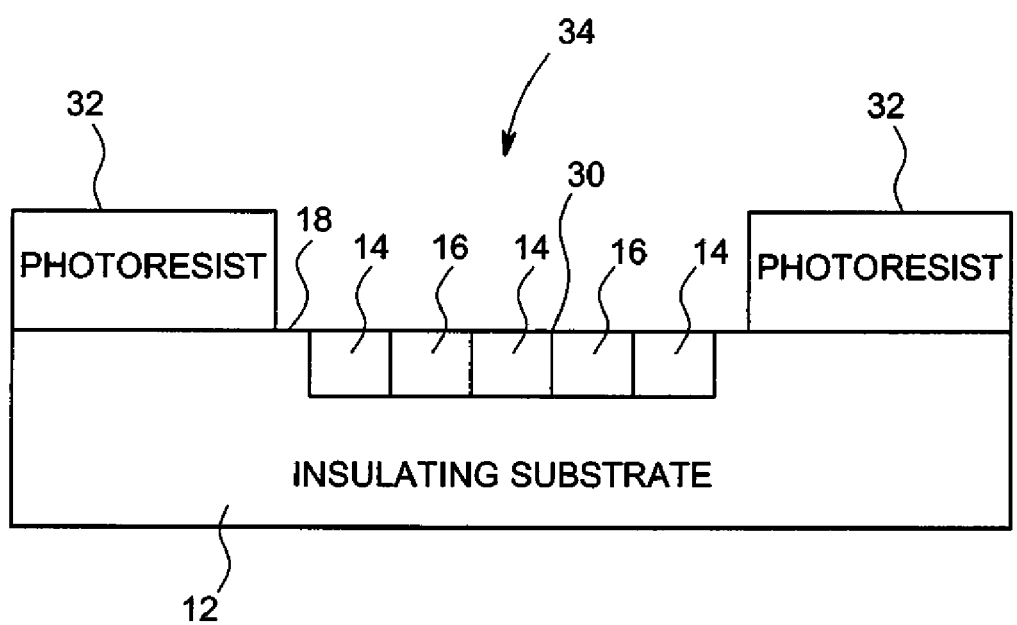
FIG. 5 is a schematic diagram of an exemplary embodiment of a step in a method of integrating a permanent bias magnet within a magnetoresistance sensor.
Figure 6:
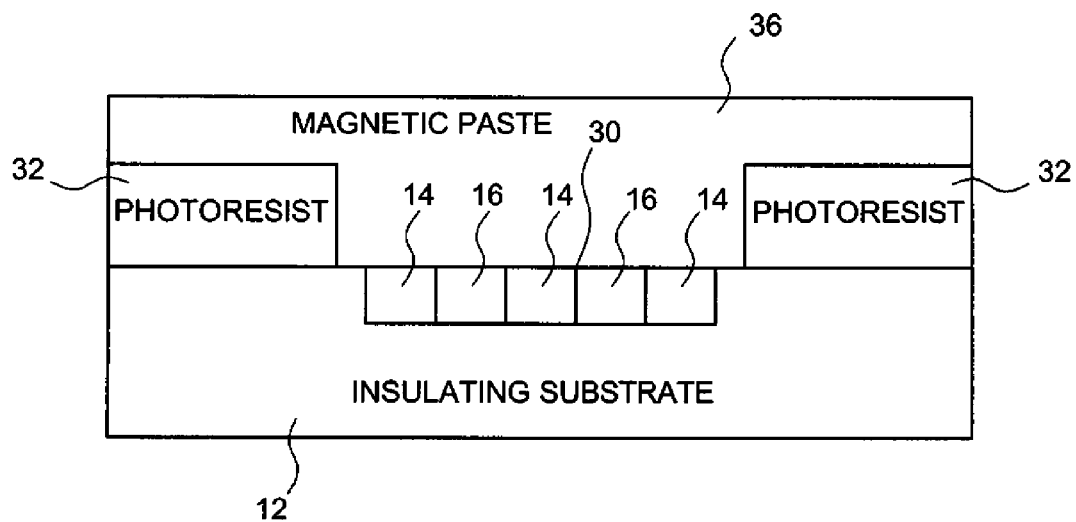
FIG. 6 is a schematic diagram of an exemplary embodiment of a step in a method of integrating a permanent bias magnet within a magnetoresistance sensor.
Figure 7:
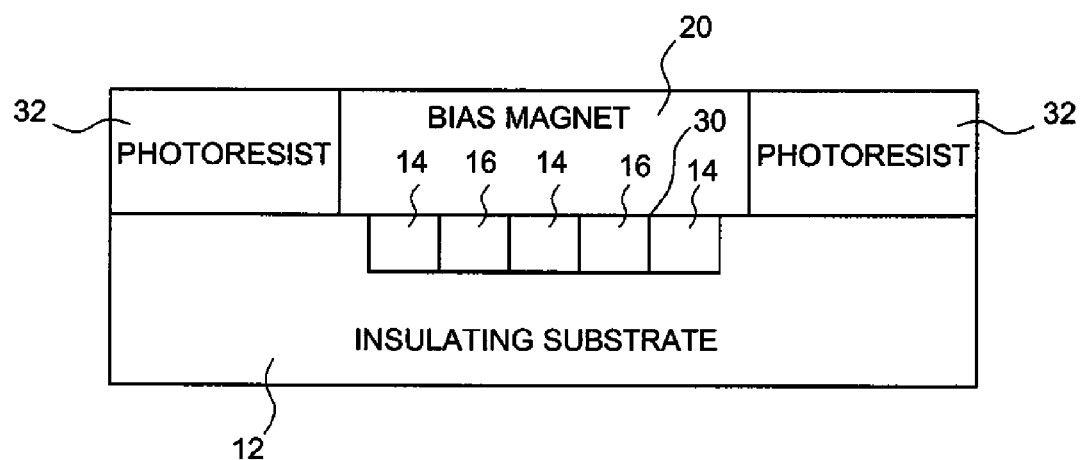
FIG. 7 is a schematic diagram of an exemplary embodiment of a step in a method of integrating a permanent bias magnet within a magnetoresistance sensor.
Figure 8:
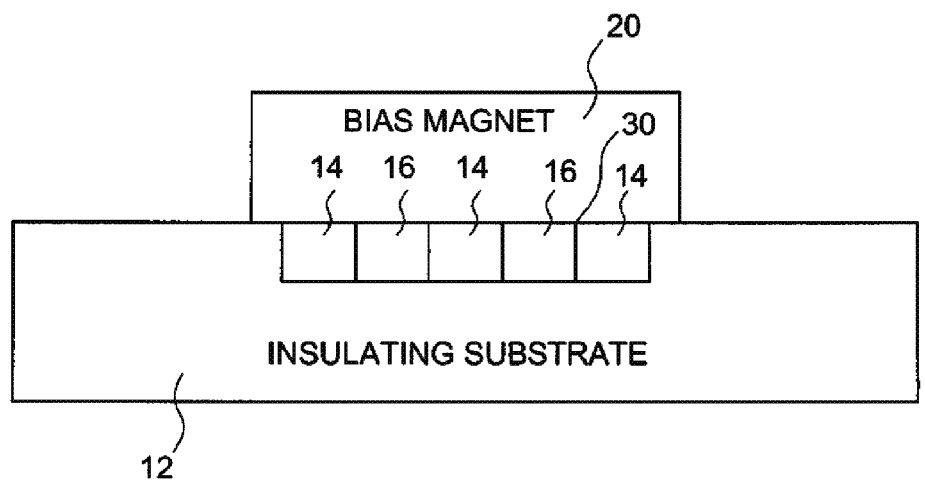
FIG. 8 is a schematic diagram of an exemplary embodiment of a step in a method of integrating a permanent bias magnet within a magnetoresistance sensor.
Figure 9:
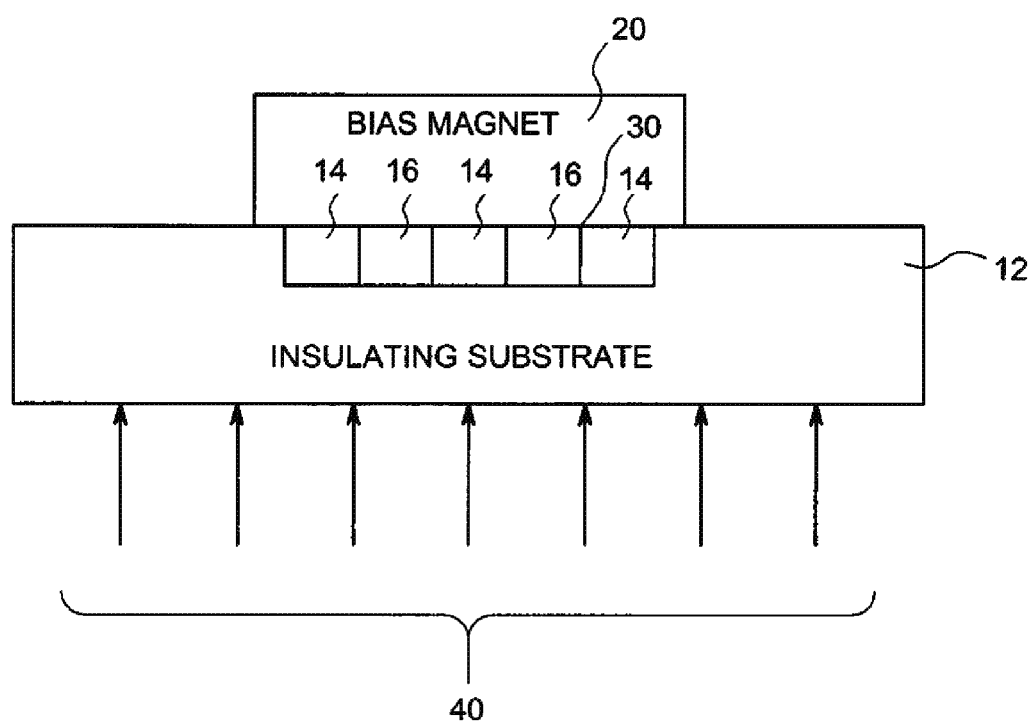
FIG. 9 is a schematic diagram of an exemplary embodiment of a step in a method of integrating a permanent bias magnet within a magnetoresistance sensor.
Figure 10:
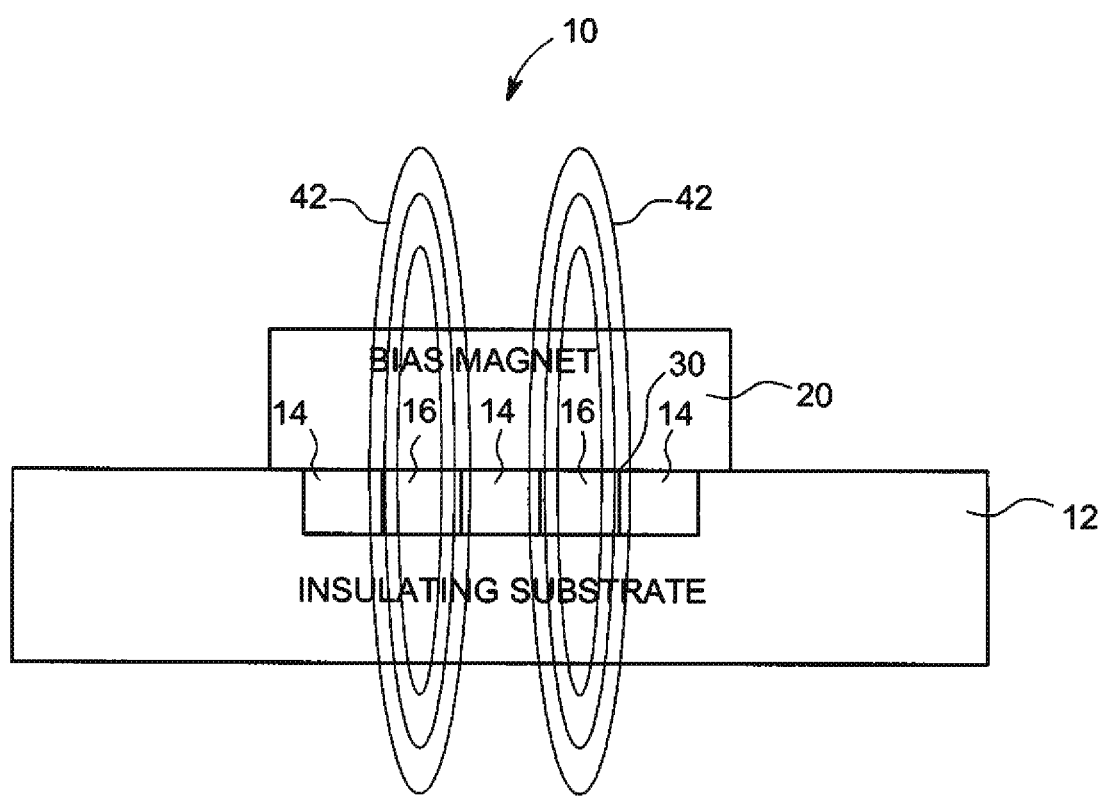
FIG. 10 is a schematic diagram of an exemplary embodiment of a magnetoresistance sensor with an integrated permanent bias magnet.

FIG. 3 illustrates a flow diagram of an exemplary embodiment of a method 50 of integrating a permanent bias magnet within a magnetoresistance sensor. The method 50 begins with depositing an alternating pattern of a metal material and a semiconductor material on or within a surface of an insulating substrate 52. This step 52 is illustrated in FIG. 4 and described in more detail below with reference to FIG. 4. Another step of the method 50 includes depositing a photoresist mask on the surface of the insulating substrate in a pattern that covers the surface of the insulating substrate, but does not cover the alternating pattern of metal material and semiconductor material 54. This step 54 is illustrated in FIG. 5 and described in more detail below with reference to FIG. 5. The next step of the method includes applying a magnetic paste over the photoresist mask and the exposed alternating pattern of metal material and semiconductor material in opening 56. This step 56 is illustrated in FIG. 6 and described in more detail below with reference to FIG. 6. The next step of the method includes removing the magnetic paste from the photoresist mask 58. This step 58 is illustrated in FIG. 7 and described in more detail below with reference to FIG. 7. The next step of the method includes curing the magnetic paste left in the openings to form bias magnets above the alternating pattern of metal material and semiconductor material 60. This step 60 is illustrated in FIG. 8 and described in more detail below with reference to FIG. 8. The next step of the method includes removing the photoresist mask 62. This step 62 is illustrated in FIG. 9 and described in more detail below with reference to FIG. 9. The last step in the process is applying a strong magnetic field to magnetize the bias magnets 64. This step 64 is illustrated in FIG. 10 and described in more detail below with reference to FIG. 10.

FIG. 4 illustrates an enlarged side schematic diagram of an exemplary embodiment of step 52 in method 50 of integrating a permanent bias magnet within a magnetoresistance sensor. As described earlier with reference to FIGS. 1 and 2, a method of producing a plurality of magnetoresistance sensors involves fabricating an insulating substrate wafer with a plurality of magnetoresistance sensors. The active area of a single magnetoresistance sensor is approximately 0.05 mm to 5 mm. The approximate size of an insulating substrate wafer is approximately 25 mm to 1 m. As shown in FIG. 4, the method 50 begins with step 52 of depositing an alternating pattern of a metal material 14 and a semiconductor material 16 on or within a surface 18 of an insulating substrate 12.

FIG. 5 illustrates an enlarged side schematic diagram of an exemplary embodiment of step 54 in method 50 of integrating a permanent bias magnet within a magnetoresistance sensor. As shown in FIG. 5, the next step 54 of the method 50 includes depositing a photoresist mask 32 on the surface 18 of the insulating substrate 12 in a pattern to cover the surface 18 of the insulating substrate 12, but not cover the alternating pattern of metal material 14 and semiconductor material 16. The photoresist mask 32 is used to create an opening 34 above the alternating pattern of metal material 14 and semiconductor material 16 where a permanent bias magnet may be formed. The photoresist mask 32 is registered with the alternating pattern of metal material 14 and semiconductor material 16. In an exemplary embodiment, the photoresist mask 32 may be deposited and patterned using a lithographic mask or other techniques known in the art. Examples of photoresist that may be used include AZ50XT from AZ Chemicals, Inc., SIPR 7126M from Shin-Etsu MicroSi, Inc., and WB3100 or WBR2100 from E. I. du Pont de Nemours and Company.

In an exemplary embodiment, a stencil or a screen printed mask may be used instead of a photoresist mask, to define the areas where the permanent magnets are to be formed.

In an exemplary embodiment, a subtractive process such as laser ablation, diamond sawing or chemical etching may be used to define the areas where the permanent magnets are to be formed.

FIG. 6 illustrates an enlarged side schematic diagram of an exemplary embodiment of step 56 in method 50 of integrating a permanent bias magnet within a magnetoresistance sensor. As shown in FIG. 6, the next step 56 of the method 50 includes applying a magnetic paste 36 over the photoresist mask 32 and the exposed alternating pattern of metal material 14 and semiconductor material 16 in opening 34. The magnetic paste 36 may include a magnetic powder and a binder that are blended together and applied over the photoresist mask 32 and the exposed alternating pattern of metal material 14 and semiconductor material 16 in opening 34. Examples of magnetic powder that may be used include Neodymium Iron Boron (NdFeB) from Magnequench International, Inc., a magnetic powder being identified as MQP-S-11-9 from Magnequench, International, Inc., Samarium Iron Nitrogen (Sm-FeN) from Sumitomo Metal Mining Co., Ltd., Samarium Cobalt (SmCo) from Alfa Aesar, Cobalt Platinum (CoPt), or Iron Platinum (FePt). Examples of the binder that may be used include Epo-Tek 360, a low viscosity two-part epoxy from Epoxy Technology, Inc. or 9-20557, a UV curable epoxy (conformal coating) from Dymax Corporation.

FIG. 7 illustrates an enlarged side schematic diagram of an exemplary embodiment of steps 58 and 60 in method 50 of integrating a permanent bias magnet within a magnetoresistance sensor. As shown in FIG. 7, the next steps 58 and 60 of the method 50 include removing the magnetic paste 36 above the photoresist mask 32 and curing the remaining magnetic paste 36 within the opening 34 above the exposed alternating pattern of metal material 14 and semiconductor material 16 to form a hardened bias magnet 20. In an exemplary embodiment, the curing process may include 24 hours at room temperature, 24 hours at 60 degrees Celsius and 24 hours at 70 degrees Celsius. It is important that the photoresist does not flow during the curing process.

FIG. 8 illustrates an enlarged side schematic diagram of an exemplary embodiment of step 62 in method 50 of integrating a permanent bias magnet within a magnetoresistance sensor. As shown in FIG. 8, the next step 62 of the method 50 includes removing the photoresist mask 32 from around hardened bias magnet 20. In an exemplary embodiment, the photoresist mask 32 may be removed using a suitable stripping chemical such as acetone or N-methyl 2-pyrrolidone (NMP). In an exemplary embodiment, the stripping process may include an acetone spray for 30 seconds at room temperature. It is important that the stripping process does not attack the binder.

In an exemplary embodiment, the permanent bias magnets may be fabricated on a separate substrate and then bonded (including the separate substrate) to the magnetoresistance sensor substrate.

FIG. 9 illustrates an enlarged side schematic diagram of an exemplary embodiment of step 64 in method 50 of integrating a permanent bias magnet within a magnetoresistance sensor. As shown in FIG. 9, the next step 64 of the method 50 includes applying a strong magnetic field 40 to magnetize the bias magnet 20. The bias magnet 20 (micromanget) is magnetized by placing the magnetoresistance sensor in a strong magnetic field at the desired orientation. The applied magnetic field may be approximately between 1 to 5 Tesla, depending upon the magnetic material's coercivity. The desired orientation of the magnetoresistance sensor within the strong magnetic field may be a perpendicular or parallel orientation.

FIG. 10 illustrates an enlarged side schematic diagram of an exemplary embodiment of an alternating pattern of metal material 14 and semiconductor material 16 with an integrated permanent bias magnet 20 forming a magnetoresistance sensor 10. After removal from the magnetizer, the permanent bias magnet 20 generates a large perpendicular field over the magnetoresistance sensor 10 active area. The magnetic flux lines 42 are shown in FIG. 10.

In an exemplary embodiment, the permanent bias magnet 20 footprint may be approximately 0.25 mm×0.25 mm. This footprint may be controlled by the photoresist mask opening 34. In an exemplary embodiment, the permanent bias magnet 20 height may be approximately 0.2 mm. This height may be controlled by photoresist mask 32 thickness.

The present disclosure provides a method for low-cost integration of micron-scale permanent bias magnets within magnetoresistance sensors. In addition, the present disclosure provides a method for generating a strong, relatively uniform perpendicular magnetic bias field for magnetoresistance sensors. The perpendicular magnetic bias field may be used to maximize the sensitivity of the magnetoresistance sensors.

While the disclosure has been described with reference to various embodiments, those skilled in the art will appreciate that certain substitutions, alterations and omissions may be made to the embodiments without departing from the spirit of the disclosure. Accordingly, the foregoing description is meant to be exemplary only, and should not limit the scope of the disclosure as set forth in the following claims.

What is claimed is:

1. A method of integrating a permanent bias magnet within a magnetoresistance sensor comprising:
   depositing an alternating pattern of a metal material and a semiconductor material on or within a surface of an insulating substrate;
   depositing a mask on the surface of the insulating substrate to create an opening above the alternating pattern of the metal material and the semiconductor material;
   applying a magnetic paste within the opening above the alternating pattern of the metal material and the semiconductor material;
   curing the magnetic paste to form a hardened bias magnet;
   removing the mask; and
   magnetizing the hardened bias magnet by applying a strong magnetic field to the hardened bias magnet at a desired orientation.

2. The method of claim 1, wherein the mask is a photoresist mask.

3. The method of claim 2, wherein the mask is a lithographic mask.

4. The method of claim 1, wherein the mask is a screen printed mask.

5. The method of claim 1, wherein the mask is formed using at least one of laser ablation, diamond sawing or chemical etching.

6. The method of claim 1, wherein the magnetic paste includes a magnetic powder and a binder that are blended together.

7. The method of claim 1, wherein the mask is removed using a stripping chemical.

8. The method of claim 1, wherein the hardened bias magnet is fabricated on a separate substrate and bonded to the insulating substrate above the alternating pattern of the metal material and the semiconductor material.

9. The method of claim 1, wherein the desired orientation is a perpendicular or parallel orientation.

10. The method of claim 1, wherein the magnetized hardened bias magnet generates a large perpendicular field over the magnetoresistance sensor.

11. A method of producing an integrated magnetoresistance sensor assembly including a permanent bias magnet comprising:
- depositing an alternating pattern of a metal material and a semiconductor material on or within a surface of an insulating substrate;
- depositing a photoresist mask on the surface of the insulating substrate in a pattern that covers the surface of the insulating substrate, but does not cover the alternating pattern of the metal material and the semiconductor material, leaving an opening above the alternating pattern of the metal material and the semiconductor material;
- applying a magnetic paste over a surface of the photoresist mask and filling the opening above the alternating pattern of the metal material and the semiconductor material with the magnetic paste;
- removing the magnetic paste from the surface of the photoresist mask;
- curing the magnetic paste within the opening above the alternating pattern of the metal material and the semiconductor material to form a hardened bias magnet;
- removing the photoresist mask from around the hardened bias magnet; and
- applying a strong magnetic field to the hardened bias magnet at a desired orientation to magnetize the hardened bias magnet.

12. The method of claim 11, wherein the magnetic paste includes a magnetic powder and a binder that are blended together.

13. The method of claim 11, wherein the photoresist mask is removed using a stripping chemical.

14. The method of claim 11, wherein the hardened bias magnet is fabricated on a separate substrate and bonded to the insulating substrate above the alternating pattern of the metal material and the semiconductor material.

15. The method of claim 11, wherein the desired orientation is a perpendicular or parallel orientation.

16. The method of claim 11, wherein the magnetized hardened bias magnet generates a large perpendicular field over the magnetoresistance sensor.

* * * * *